(12) United States Patent
Zhao et al.

(10) Patent No.: US 12,379,338 B1
(45) Date of Patent: Aug. 5, 2025

(54) TESTING METHOD FOR CARRIER MOBILITY OF INSULATING POLYMERS

(71) Applicant: Shanghai Jiao Tong University, Shanghai (CN)

(72) Inventors: Su Zhao, Shanghai (CN); Yi Yin, Shanghai (CN); Zhe Zheng, Yancheng (CN); Luyao Zhong, Ma'anshan (CN); Xiaolei Zhao, Shanghai (CN); Yalin Wang, Shanghai (CN); Lu Fan, Yancheng (CN); Jiandong Wu, Shanghai (CN)

(73) Assignee: Shanghai Jiao Tong University, Shanghai (CN)

( * ) Notice: Subject to any disclaimer, the term of this patent is extended or adjusted under 35 U.S.C. 154(b) by 0 days.

(21) Appl. No.: 19/177,091

(22) Filed: Apr. 11, 2025

(30) Foreign Application Priority Data

Aug. 16, 2024 (CN) .......................... 202411126647.9

(51) Int. Cl.
*G01N 27/00* (2006.01)
*G01R 19/00* (2006.01)
(Continued)

(52) U.S. Cl.
CPC ......... *G01N 27/00* (2013.01); *G01R 19/0007* (2013.01); *G01R 31/1263* (2013.01);
(Continued)

(58) Field of Classification Search
CPC .... G01N 27/00; G01R 19/0007; G01R 31/14; G01R 19/00; G01R 31/00; G01R 31/1263; H05G 1/26; H05G 1/12
See application file for complete search history.

(56) References Cited

U.S. PATENT DOCUMENTS 6,489,776 B1 * 12/2002 Stowe ................... G01R 29/24
324/458

FOREIGN PATENT DOCUMENTS

CN 116699247 A 9/2023

OTHER PUBLICATIONS

CNIPA, Notification of a First Office Action for CN202411126647.9, Jan. 24, 2025.
(Continued)

*Primary Examiner* — Judy Nguyen
*Assistant Examiner* — Adam S Clarke
(74) *Attorney, Agent, or Firm* — Hemisphere Law, PLLC; Zhigang Ma

(57) ABSTRACT

A testing method for carrier mobility of insulating polymers is provided, which is based on a testing device for carrier mobility of insulating polymers, including a first box; a second box, disposed inside the first box, provided with a partition plate, and defining a first space and a second space through the partition plate; a sample frame, configured to fix a sample, and disposed in the first space; an X-ray source, disposed in the second space, and configured to generate and emit X-rays to irradiate the sample, to excite generation of carriers in the sample; a voltage generation component, in line connection with the sample, to apply a triangular wave voltage to two ends of the sample, to thereby make the carriers generated in the sample move; and a current detection component, connected to the sample, to thereby collect current signals of the sample generated by movement of the carriers.

10 Claims, 2 Drawing Sheets

(51) Int. Cl.
  *G01R 31/12*  (2020.01)
  *G01R 31/14*  (2006.01)
  *H05G 1/12*  (2006.01)
  *H05G 1/26*  (2006.01)

(52) U.S. Cl.
  CPC .............. *G01R 31/14* (2013.01); *H05G 1/12* (2013.01); *H05G 1/26* (2013.01)

(56) References Cited

OTHER PUBLICATIONS

Shanghai Jiaotong University (Applicant), Replacement claims (allowed) of CN202411126647.9, Feb. 8, 2025.
CNIPA, Notification to grant patent right for invention in CN202411126647.9, Feb. 25, 2025.

* cited by examiner

TESTING METHOD FOR CARRIER MOBILITY OF INSULATING POLYMERS

CROSS-REFERENCE TO RELATED APPLICATION

This application claims priority to Chinese Patent Application No. 202411126647.9, filed on Aug. 16, 2024, which is herein incorporated by reference in its entirety.

TECHNICAL FIELD

The disclosure relates to the field of electrical performance testing technologies for insulating polymer materials, and more particularly to a testing method for carrier mobility of insulating polymers.

BACKGROUND

Insulating polymer materials have a wide range of applications and importance in modern science and industry. These materials are widely used in electrical and electronic equipment, such as cable insulation layers, capacitor dielectrics, printed circuit boards (PCBs), and electronic packaging materials, due to their excellent insulation properties, high voltage resistance, chemical corrosion resistance, and mechanical strength. In the power system, the insulating polymer materials are used for the insulation of cables, transformers, and switchgear to ensure the safe transmission of electricity and the long-term stable operation of equipment. In addition, with the miniaturization and increased integration of electronic devices, the insulating polymer materials also play a key role in microelectronic devices, semiconductor packaging, and flexible electronic products. The advantages of the insulating polymer materials in environmental friendliness and processability make it an important basic material for the development of future green electronics and smart grid technologies.

Carriers of the insulating polymer materials refer to charge carriers that can move freely in the insulating polymer materials, mainly including electrons and holes. The mobility of the carriers, that is, mobility, is one of the key parameters that determine the electrical properties of the insulating polymer materials. Carrier mobility directly affects the insulation properties of the materials and is an important indicator for evaluating material performance.

However, the current carrier mobility measurement methods are all for semiconductor materials, since semiconductors have high carrier mobility that are easy to detect. For the insulating polymer materials with low mobility, there is currently no mature carrier mobility detection method. Therefore, it is necessary to design a testing method for carrier mobility of insulating polymers to solve the above technical problems.

SUMMARY

An objective of the disclosure is to provide a testing method for carrier mobility of insulating polymers, aiming to solve the problems of low testing accuracy, complex system and limited application scope.

In order to achieve the above objective, the technical solutions of the disclosure are as follows.

A testing method for carrier mobility of insulating polymers is based on a testing device for carrier mobility of insulating polymers, and the testing device for carrier mobility of insulating polymers includes a first box, a second box, a sample frame, an X-ray source, a voltage generation component and a current detection component. The second box is disposed inside the first box, a partition plate is disposed in the second box, and the second box defines a first space and a second space through the partition plate. The sample frame is configured to fix a sample, and is disposed in the first space. The X-ray source is disposed in the second space, and is configured to generate and emit X-rays to irradiate the sample, to thereby excite generation of carriers in the sample. The voltage generation component is in line connection with the sample, to apply a triangular wave voltage to two ends of the sample, to thereby make the carriers generated in the sample move. The current detection component is connected to the sample, to thereby collect current signals of the sample generated by movement of the carriers.

Specifically, the testing method includes:
  irradiating the sample by using the X-rays generated through the X-ray source, to generate the carriers in the sample, exciting the carriers to move by using the X-rays, applying the triangular wave voltage on the sample, and measuring a carrier mobility of the sample by measuring induced current.

In an embodiment, the first box includes a first sidewall, a first top plate and a first bottom plate, and the first top plate and the first bottom plate are disposed on an upper end and a lower end of the first sidewall respectively. Each of the first sidewall, the first top plate and the first bottom plate is a first sandwich structure, and the first sandwich structure includes a first steel plate, a first lead plate and a second steel plate sequentially connected in that order.

In an embodiment, the first box is hollow cylindrical, with a diameter of 35 centimeters (cm) to 45 cm, and a height of 50 cm to 70 cm.

In an embodiment, a thickness of the first sandwich structure is 1.2 cm, a thickness of each of the first steel plate and the second steel plate is 1 millimeter (mm), and a thickness of the first lead plate is 10 mm.

In an embodiment, the second box includes a second sidewall, a second top plate and a second bottom plate, and the second top plate and the second bottom plate are disposed on an upper end and a lower end of the second sidewall respectively. Each of the second sidewall, the second top plate and the second bottom plate is a second sandwich structure, and the second sandwich structure includes a third steel plate, a second lead plate and a fourth plate sequentially connected in that order.

In an embodiment, the second box is hollow cylindrical, with a diameter of 25 cm to 35 cm, and a height of 30 cm to 60 cm.

In an embodiment, a thickness of the second sandwich structure is 1.2 cm, a thickness of each of the third steel plate and the fourth steel plate is 1 mm, and a thickness of the second lead plate is 10 mm.

In an embodiment, the partition plate is a lead plate.

In an embodiment, the testing device further includes an X-ray excitation power supply, and the X-ray excitation power supply includes a direct-current (DC) power supply, a self-excited oscillation circuit and a capacitor series voltage doubling circuit. An output end of the DC power supply is connected to an input end of the self-excited oscillation circuit, an output end of the self-excited oscillation circuit is connected to an input end of the capacitor series voltage doubling circuit, and output end of the capacitor series voltage doubling circuit is connected to an input end of the X-ray source.

In an embodiment, the testing device further includes a data processor, the data processor is in signal connection with the current detection component, to thereby calculate the carrier mobility of the sample according to the current signals fed by the current detection component.

The beneficial effects of the disclosure are as follows.

1. The disclosure uses the X-rays to excite the carriers to move, applies the triangular wave voltage on the insulating polymer materials (i.e., the sample), and measures the induced current to effectively measure the carrier mobility of the insulating polymer materials.
2. The disclosure uses the X-rays for excitation, which can effectively excite the carriers in the insulating polymer materials. Compared with the traditional light excitation method, X-ray excitation has higher penetration and excitation efficiency, can excite the carriers more evenly, and reduce the influence of the sample surface and thickness on the test results.
3. By applying the triangular wave voltage and measuring the induced current, the disclosure can accurately detect the movement of the carriers. The highly sensitive current sensor and high-speed data acquisition device ensure the accurate capture of weak current signals, significantly improving the sensitivity and accuracy of the test.
4. Compared with the traditional time-resolved photoconductivity method and field effect mobility measurement method, the disclosure does not require a complex optical system and high-precision voltage control equipment, simplifies the system design, and reduces the test cost. The disclosure is applicable to various types of insulating polymer materials, including low-mobility and high-mobility samples, and can meet the test requirements of different materials.

In summary, the disclosure effectively solves the problems of low test accuracy, complex system, and limited application scope in the related art, and provides an efficient, accurate and widely applicable test solution for carrier mobility of insulating polymer materials. This technical solution not only has important scientific research value, but also has broad prospects in practical applications, which is helpful to promote the research and development of insulating polymer materials and related electronic devices.

DESCRIPTION OF REFERENCE SIGNS

Figure 1:
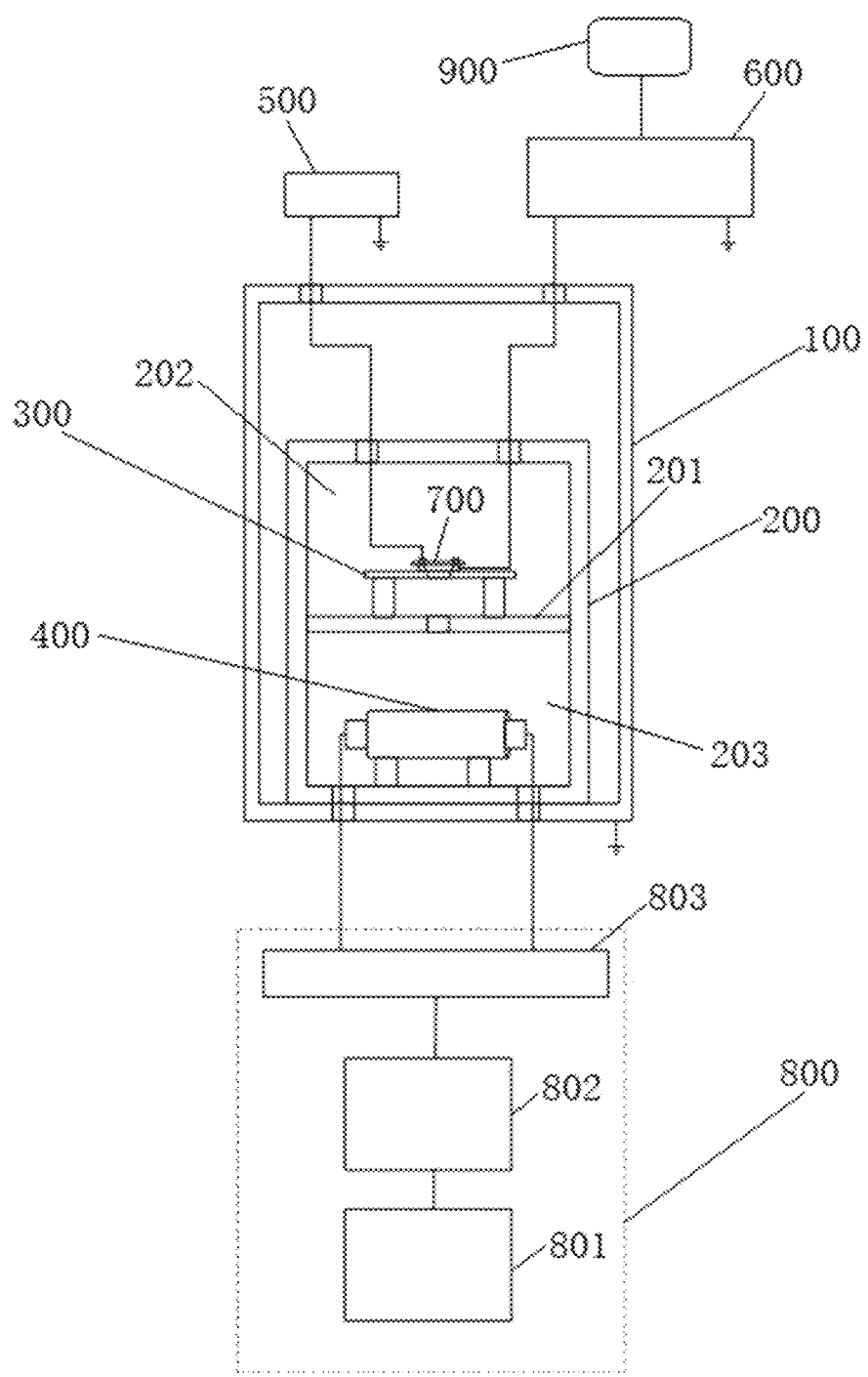
FIG. 1 illustrates a schematic structural diagram of a testing device for carrier mobility of insulating polymers according to an embodiment of the disclosure.

100—first box; 101—first sidewall; 102—first top plate; 103—first bottom plate; 104—first sandwich structure; 1041—first steel plate; 1042—first lead plate; 1043—second steel plate; 200—second box; 201—partition plate; 202—first space; 203—second space; 204—second sidewall; 205—second top plate; 206—second bottom plate; 207—second sandwich structure; 2071—third steel plate; 2072—second lead plate; 2073—fourth steel plate; 300—sample frame; 400—X-ray source; 500—voltage generation component; 600—current detection component; 700—sample; 800—X-ray excitation power supply; 801—DC power supply; 802—self-excited oscillation circuit; 802—compactor series voltage doubling circuit; 900—data processor.

DETAILED DESCRIPTION OF EMBODIMENTS

The following describes embodiments of the disclosure by specific examples, and those skilled in the art can easily understand other advantages and effects of the disclosure from the contents disclosed in this specification. The disclosure can also be implemented or applied through other different specific embodiments, and the details in this specification can also be modified or changed in various ways based on different viewpoints and applications without departing from the spirit of the disclosure. It should be noted that the following embodiments and features in the embodiments can be combined with each other without conflict.

In the description of the disclosure, unless otherwise specified, "plurality" means two or more than two; the orientations or positional relationships indicated by the terms "upper", "lower", "left", "right", "inner", "outer", "front end", "rear end", "head" and "tail" are based on the orientations or positional relationships shown in the drawings, and are only for the convenience of describing the disclosure and simplifying the description, and do not indicate or imply that the device or element referred to must have a specific orientation, be constructed and operate in a specific orientation, and therefore cannot be understood as limiting the disclosure. In addition, the terms "first", "second" and "third" are only used for descriptive purposes and cannot be understood as indicating or implying relative importance.

In the description of the disclosure, it should be noted that, unless otherwise clearly specified and limited, the terms "connected" and "connection" should be understood in a broad sense, for example, it can be a fixed connection, a detachable connection, or an integral connection; it can be a mechanical connection or an electrical connection; it can be a direct connection or an indirect connection through an intermediate medium. For those skilled in the art, the specific meanings of the above terms in the disclosure can be understood according to specific circumstances.

The specific implementation of the disclosure is further described in detail below in conjunction with the drawings and embodiments.

Referring to FIG. 1, FIG. 1 illustrates a schematic structural diagram of a testing device for carrier mobility of insulating polymers according to an embodiment of the disclosure. The embodiments of the disclosure provide a testing method for carrier mobility of insulating polymers, to accurately measure the mobility value of a low-mobility insulating polymer material. Specifically, the testing method for carrier mobility of insulating polymers is based on a testing device for carrier mobility of insulating polymers, which includes a first box 100, a second box 200, a sample frame 300, an X-ray source 400, a voltage generation component 500 and a current detection component 600. The second box 200 is disposed inside the first box 100, a partition plate 201 is disposed in the second box 200, and the second box 200 defines a first space 202 and a second space 203 through the partition plate 201. The sample frame 300 is configured to fix a sample 700, and is disposed in the first space 202. The X-ray source 400 is disposed in the second space 203, and is configured to generate and emit X-rays to irradiate the sample 700, to thereby excite generation of carriers in the sample 700. The voltage generation component 500 is in line connection with the sample 700, to apply a triangular wave voltage to two ends of the sample 700, to thereby make the carriers generated in the sample 700 move. The current detection component 600 is connected to the sample 700, to thereby collect current signals of the sample 700 generated by movement of the carriers.

Specifically, the testing method includes the follows. The sample is irradiated by using the X-rays generated through the X-ray source, to generate the carriers in the sample, the carriers are excited to move by using the X-rays, the triangular wave voltage is applied on the sample, and a carrier mobility of the sample is measured by measuring induced current.

It should be noted that the sample 700 described in the disclosure is a sample prepared by using insulating polymer materials. The insulating polymer material is a polymer insulating material, also known as a polymer dielectric, which is used to isolate charged or different potential conductors, so that current can flow in a certain direction. A volume resistivity of the insulating polymer material is generally greater than 109 ohms-centimeter (Ω·cm).

In the disclosure, the inner and outer box structure composed of the first box 100 and the second box 200 plays a role in preventing the internal X-rays from leaking out and affecting the safety of personnel and the environment. The X-ray source generates the X-rays to irradiate the sample 700, to make the sample 700 generate carriers therein, and cooperates with the triangular wave voltage generated by the voltage generation component 500 to make the carriers in the sample 700 move, and finally calculates the carrier mobility of the sample 700 according to the current signals generated by the movement of the carriers collected by the current detection component 600. The device can meet the test requirements of samples with low mobility.

Specifically, a calculation formula of the carrier mobility u is expressed as follows:

$$\mu = \frac{1}{neE};$$

where I represents the measured current, n represents a carrier concentration (a property of the material itself, which can be obtained by looking up a table or theoretical calculation), e represents an electron charge, and E represents an electric field strength.

In order to verify that the testing method for carrier mobility of insulating polymers can accurately measure the carrier mobility of the sample with a low mobility, a cross-linked polyethylene sample is selected for testing, which has a thickness of 200 microns (μm), and a size of length×width being 10 cm×10 cm.

The testing device for carrier mobility of insulating polymers is used, the sample (i.e., the cross-linked polyethylene sample) is fixed on the sample frame 300 inside the device, to ensure that the X-rays can irradiate the sample. An excitation voltage of the X-ray source 400 is set as 160 kilovolts (kV), and an excitation time of the X-ray source 400 is set as 1 second(s). The triangular wave voltage is applied to the sample with a voltage amplitude of 20 volts (V) and a frequency of 2 hertz (Hz).

The measured current I is $2 \times 10^{-9}$ amperes (A).

The carrier concentration n of the sample is assumed as $1 \times 10^{15}$ per cubic centimeter ($cm^{-3}$).

The applied electric field strength E is $1 \times 10^5$ volts per meter (V/m).

Through calculation, the carrier mobility μ of the sample is $2 \times 10^{-7}$ square centimeter per volt second ($cm^2/V \cdot s$).

During multiple tests, the value of the carrier mobility of the cross-linked polyethylene sample is stable between $1.8 \times 10^{-7}$ $cm^2/V \cdot s$ to $2.2 \times 10^{-7}$ $cm^2/V \cdot s$. The value is consistent with the mobility data of cross-linked polyethylene materials that have been reported, which verifies the effectiveness and accuracy of the testing method.

Figure 2:
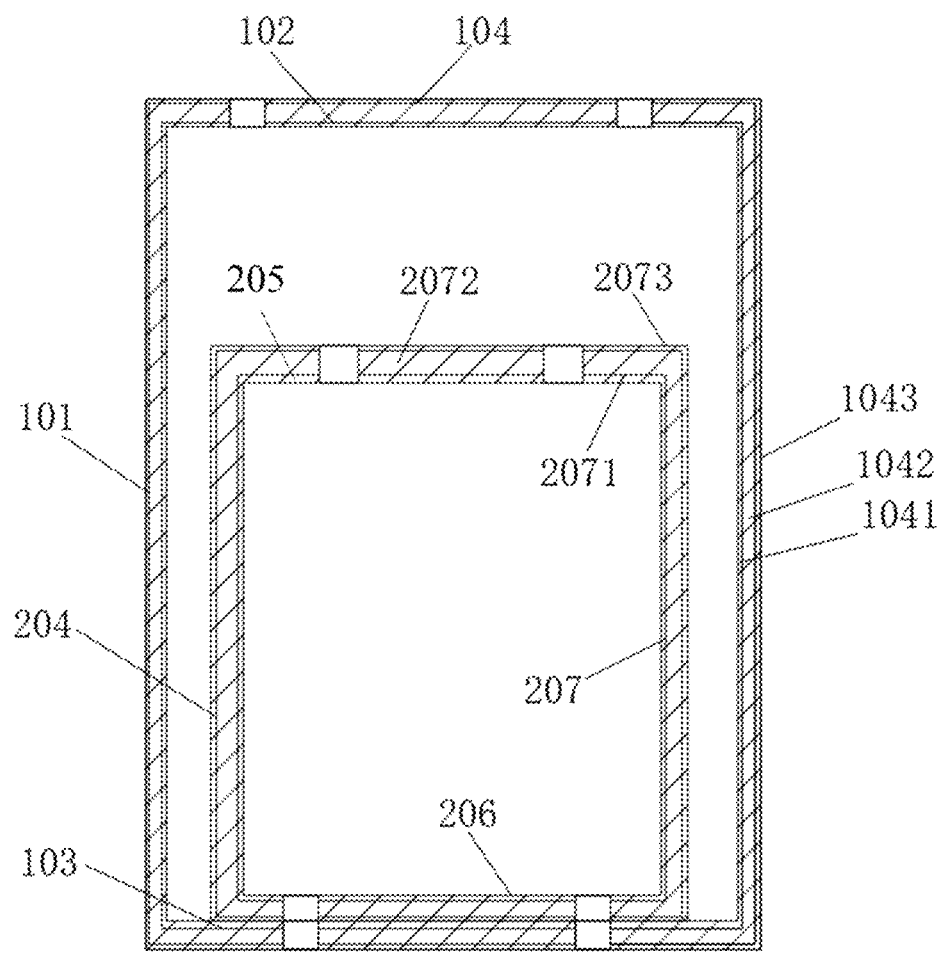
FIG. 2 illustrates a schematic sectional diagram of a first box and a second box of the testing device for carrier mobility of insulating polymers according to the embodiment of the disclosure.

In some embodiments, referring to FIG. 2, FIG. 2 illustrates a schematic sectional diagram of a first box and a second box of the testing device for carrier mobility of insulating polymers according to the embodiment of the disclosure, and FIG. 2 provides a specific structure of the first box 100. The first box 100 includes a first sidewall 101, a first top plate 102 and a first bottom plate 103, and the first top plate 102 and the first bottom plate 102 are disposed on an upper end and a lower end of the first sidewall 101 respectively. Each of the first sidewall 101, the first top plate 102 and the first bottom plate 103 is a first sandwich structure 104, and the first sandwich structure 104 includes a first steel plate 1041, a first lead plate 1042 and a second steel plate 1043 sequentially connected in that order.

In some embodiments, the first box 100 is hollow cylindrical, with a diameter of 35 cm to 45 cm, and a height of 50 cm to 70 cm. A thickness of the first sandwich structure 104 is 1.2 cm, a thickness of each of the first steel plate 1041 and the second steel plate 1043 is 1 mm, and a thickness of the first lead plate 1042 is 10 mm.

Exemplarily, the first box 100 is hollow cylindrical, with a diameter of 40 cm, and a height of 60 cm. A thickness of each of the first sidewall 101, the first top plate 102 and the first bottom plate 103 is 1.2 cm, which is the first sandwich structure 104. The first sandwich structure 104 includes the first steel plate 1041 and the second steel plate 1043 with a thickness of 1 mm, and the first lead plate 1042 with a thickness of 10 mm and located between the first steel plate 1041 and the second steel plate 1043, which is used to prevent the internal X-rays from leaking out and affecting the safety of personnel and the environment.

In some embodiments, a specific structure of the second box 200 is provided. As shown in FIG. 2, the second box 200 includes a second sidewall 204, a second top plate 205 and a second bottom plate 206, and the second top plate 205 and the second bottom plate 206 are disposed on an upper end and a lower end of the second sidewall 204 respectively. Each of the second sidewall 204, the second top plate 205 and the second bottom plate 206 is a second sandwich structure 207, and the second sandwich structure 207 includes a third steel plate 2071, a second lead plate 2072 and a fourth plate 2073 sequentially connected in that order.

In some embodiments, the second box 200 is hollow cylindrical, with a diameter of 25 cm to 35 cm, and a height of 30 cm to 60 cm. A thickness of the second sandwich structure 207 is 1.2 cm, a thickness of each of the third steel plate 2071 and the fourth steel plate 2073 is 1 mm, and a thickness of the second lead plate 2072 is 10 mm.

Exemplarily, the second box 200 is hollow cylindrical, with a diameter of 30 cm, and a height of 50 cm. The second box 200 is divided into upper and lower two layers through the partition plate 201, and each layer is 25 cm high. A middle of the partition plate 201 can define a circular hole, to facilitate the passage of the X-rays. A thickness of each of the second sidewall 204, the second top plate 205 and the second bottom plate 206 is 1.2 cm, which is the second sandwich structure 207. The thickness of each of the third steel plate 2071 and the fourth steel plate 2073 is 1 mm, and the thickness of the second lead plate 2072 is 10 mm, which is used to prevent the internal X-rays from leaking out and affecting the safety of personnel and the environment.

In some embodiments, as shown in FIG. 1, the testing device further includes an X-ray excitation power supply 800, and the X-ray excitation power supply 800 includes a DC power supply 801, a self-excited oscillation circuit 802 and a capacitor series voltage doubling circuit 803. An output end of the DC power supply 801 is connected to an input end of the self-excited oscillation circuit 802, an output end of the self-excited oscillation circuit 802 is connected to an input end of the capacitor series voltage doubling circuit 803, and output end of the capacitor series voltage doubling circuit 803 is connected to an input end of the X-ray source 400.

The X-ray excitation power supply 800 is used to provide a pulse high voltage for the X-ray source 400. The pulse high voltage is generated by the follows, the DC power supply 801 generates a low voltage DC voltage (1 V to 200 V), which is then connected to the self-excited oscillation circuit 802 to generate a pulse high voltage (800 V to 10 kV), and the voltage is further increased through the capacitor series voltage doubling circuit 803 to generate the pulse high voltage (100 kV to 200 kV) that can drive the X-ray source 400.

In some embodiments, as shown in FIG. 1, the testing device further includes a data processor 900, the data processor 900 is in signal connection with the current detection component 600, to thereby calculate the carrier mobility of the sample 700 according to the current signals fed by the current detection component 600.

The above embodiments are merely used to illustrate the disclosure, but not to limit the disclosure. Those skilled in the art can make various changes and modifications without departing from the spirit and scope of the disclosure. Therefore, all equivalent technical solutions also belong to the scope of the disclosure. The patent protection scope of the disclosure should be defined by the claims.

What is claimed is:

1. A testing method for carrier mobility of insulating polymers, wherein the testing method for carrier mobility of insulating polymers is based on a testing device for carrier mobility of insulating polymers, and the testing device for carrier mobility of insulating polymers comprises:
   a first box;
   a second box, disposed inside the first box, wherein a partition plate is disposed in the second box, and the second box defines a first space and a second space through the partition plate;
   a sample frame, configured to fix a sample, wherein the sample frame is disposed in the first space;
   an X-ray source, disposed in the second space, and configured to generate and emit X-rays to irradiate the sample, to thereby excite generation of carriers in the sample;
   a voltage generation component, in line connection with the sample, to apply a triangular wave voltage to two ends of the sample, to thereby make the carriers generated in the sample move; and
   a current detection component, connected to the sample, to thereby collect current signals of the sample generated by movement of the carriers; and
   wherein the testing method comprises:
   irradiating the sample by using the X-rays generated through the X-ray source, to generate the carriers in the sample, exciting the carriers to move by using the X-rays, applying the triangular wave voltage on the sample, and measuring a carrier mobility of the sample by measuring induced current.

2. The testing method for carrier mobility of insulating polymers as claimed in claim 1, wherein the first box comprises a first sidewall, a first top plate and a first bottom plate, the first top plate and the first bottom plate are disposed on an upper end and a lower end of the first sidewall respectively, each of the first sidewall, the first top plate and the first bottom plate is a first sandwich structure, and the first sandwich structure comprises a first steel plate, a first lead plate and a second steel plate sequentially connected in that order.

3. The testing method for carrier mobility of insulating polymers as claimed in claim 2, wherein the first box is hollow cylindrical, with a diameter of 35 cm to 45 cm, and a height of 50 cm to 70 cm.

4. The testing method for carrier mobility of insulating polymers as claimed in claim 2, wherein a thickness of the first sandwich structure is 1.2 cm, a thickness of each of the first steel plate and the second steel plate is 1 mm, and a thickness of the first lead plate is 10 mm.

5. The testing method for carrier mobility of insulating polymers as claimed in claim 1, wherein the second box comprises a second sidewall, a second top plate and a second bottom plate, the second top plate and the second bottom plate are disposed on an upper end and a lower end of the second sidewall respectively, each of the second sidewall, the second top plate and the second bottom plate is a second sandwich structure, and the second sandwich structure comprises a third steel plate, a second lead plate and a fourth plate sequentially connected in that order.

6. The testing method for carrier mobility of insulating polymers as claimed in claim 5, wherein the second box is hollow cylindrical, with a diameter of 25 cm to 35 cm, and a height of 30 cm to 60 cm.

7. The testing method for carrier mobility of insulating polymers as claimed in claim 5, wherein a thickness of the second sandwich structure is 1.2 cm, a thickness of each of the third steel plate and the fourth steel plate is 1 mm, and a thickness of the second lead plate is 10 mm.

8. The testing method for carrier mobility of insulating polymers as claimed in claim 1, wherein the partition plate is a lead plate.

9. The testing method for carrier mobility of insulating polymers as claimed in claim 1, wherein the testing device further comprises an X-ray excitation power supply, the X-ray excitation power supply comprises a direct-current (DC) power supply, a self-excited oscillation circuit and a capacitor series voltage doubling circuit; and an output end of the DC power supply is connected to an input end of the self-excited oscillation circuit, an output end of the self-excited oscillation circuit is connected to an input end of the capacitor series voltage doubling circuit, and output end of the capacitor series voltage doubling circuit is connected to an input end of the X-ray source.

10. The testing method for carrier mobility of insulating polymers as claimed in any one of claims 1-9, wherein the testing device further comprises a data processor, the data processor is in signal connection with the current detection component, to thereby calculate the carrier mobility of the sample according to the current signals fed by the current detection component.

\* \* \* \* \*